United States Patent
Bharathi

(10) Patent No.: US 6,593,778 B1
(45) Date of Patent: Jul. 15, 2003

(54) ZERO DETECT CIRCUIT AND METHOD FOR HIGH FREQUENCY INTEGRATED CIRCUITS

(75) Inventor: Sandeep G. Bharathi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/655,275

(22) Filed: Sep. 5, 2000

(51) Int. Cl.[7] .................. H03K 19/082; H03K 19/20
(52) U.S. Cl. ........................................ 326/121; 326/98
(58) Field of Search .......................... 326/95–97, 104, 326/105, 112, 113, 119–122

(56) References Cited

U.S. PATENT DOCUMENTS

| | | | | |
|---|---|---|---|---|
| 3,325,653 A | * | 6/1967 | Husher et al. ............... | 326/127 |
| 3,715,603 A | * | 2/1973 | Lerch .......................... | 326/121 |
| 4,038,563 A | * | 7/1977 | Zuleeg et al. ............... | 326/112 |
| 5,241,490 A | | 8/1993 | Poon .......................... | 708/205 |
| 5,291,076 A | * | 3/1994 | Bridges et al. ............. | 326/121 |
| 5,537,063 A | * | 7/1996 | Dao ........................... | 326/121 |
| 5,592,107 A | * | 1/1997 | McDermot et al. ......... | 326/121 |
| 5,661,675 A | * | 8/1997 | Chin et al. .................... | 326/95 |
| 5,942,917 A | | 8/1999 | Chappell et al. ............ | 326/121 |
| 6,060,909 A | * | 5/2000 | Aipperspach et al. ......... | 326/98 |
| 6,060,910 A | * | 5/2000 | Inui ............................ | 326/98 |
| 6,172,531 B1 | * | 1/2001 | Aipperspach et al. ....... | 326/108 |
| 6,316,961 B2 | * | 11/2001 | Kanetani et al. .............. | 326/98 |

* cited by examiner

Primary Examiner—Tuan T. Lam
(74) Attorney, Agent, or Firm—Cynthia T. Faatz

(57) ABSTRACT

A zero detect circuit. The zero detect circuit includes a data-driven intermediate precharge device coupled to each of a plurality of data inputs to precharge an internal node in response to a data signal received via the corresponding data input. An output responsive to the data signals and to a first clock signal indicates whether all of the data signals represent logical zero data.

17 Claims, 4 Drawing Sheets

ZERO DETECT CIRCUIT AND METHOD FOR HIGH FREQUENCY INTEGRATED CIRCUITS

BACKGROUND

1. Field

An embodiment of the present invention relates to the field of high frequency integrated circuits and, more particularly, to a zero detect circuit and method for use in high frequency integrated circuits.

2. Discussion of Related Art

Zero detect circuitry, a simple example of which is a NOR gate, may be used in microprocessors and other types of integrated circuits for a variety of different purposes. For example, in a processor, zero detect circuitry may be used in floating point and/or integer execution units to detect leading zeros and/or zero data and/or in a processor front-end to process address information.

As the operating frequencies of processors and other integrated circuits continue to increase, zero detect operations should be performed very fast in order not to compromise performance of the host integrated circuit. As operating frequencies have continued to increase, data, instruction and address widths have also increased.

Conventional zero detect circuits have been implemented in static complementary metal oxide semiconductor (CMOS) logic using AND/OR gates. Static CMOS logic is notoriously slow such that a static CMOS zero detect circuit typically does not meet the needs of today's high performance microprocessors, for example. Further, multiple logic stages may be needed to implement a zero detect circuit to handle wider data, instruction and/or address information.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for performing zero detect operations in a high frequency integrated circuit are described. In the following description, particular types of integrated circuits, uses for zero detect circuitry and circuit configurations are described for purposes of illustration. It will be appreciated, however, that other embodiments are applicable to other types of integrated circuits, to other uses and to circuits configured in another manner.

For one embodiment, a zero detect circuit includes a data-driven internal node precharge device coupled to each of a plurality of data inputs. The data-driven internal node precharge devices precharge a corresponding internal node in response to a data signal received via the corresponding data input. The circuit further includes an output responsive to the data signals and to a first clock signal to indicate whether all of the data signals represent logical zero data. Additional details of this and other embodiments are described below in reference to the Figures.

Figure 1:
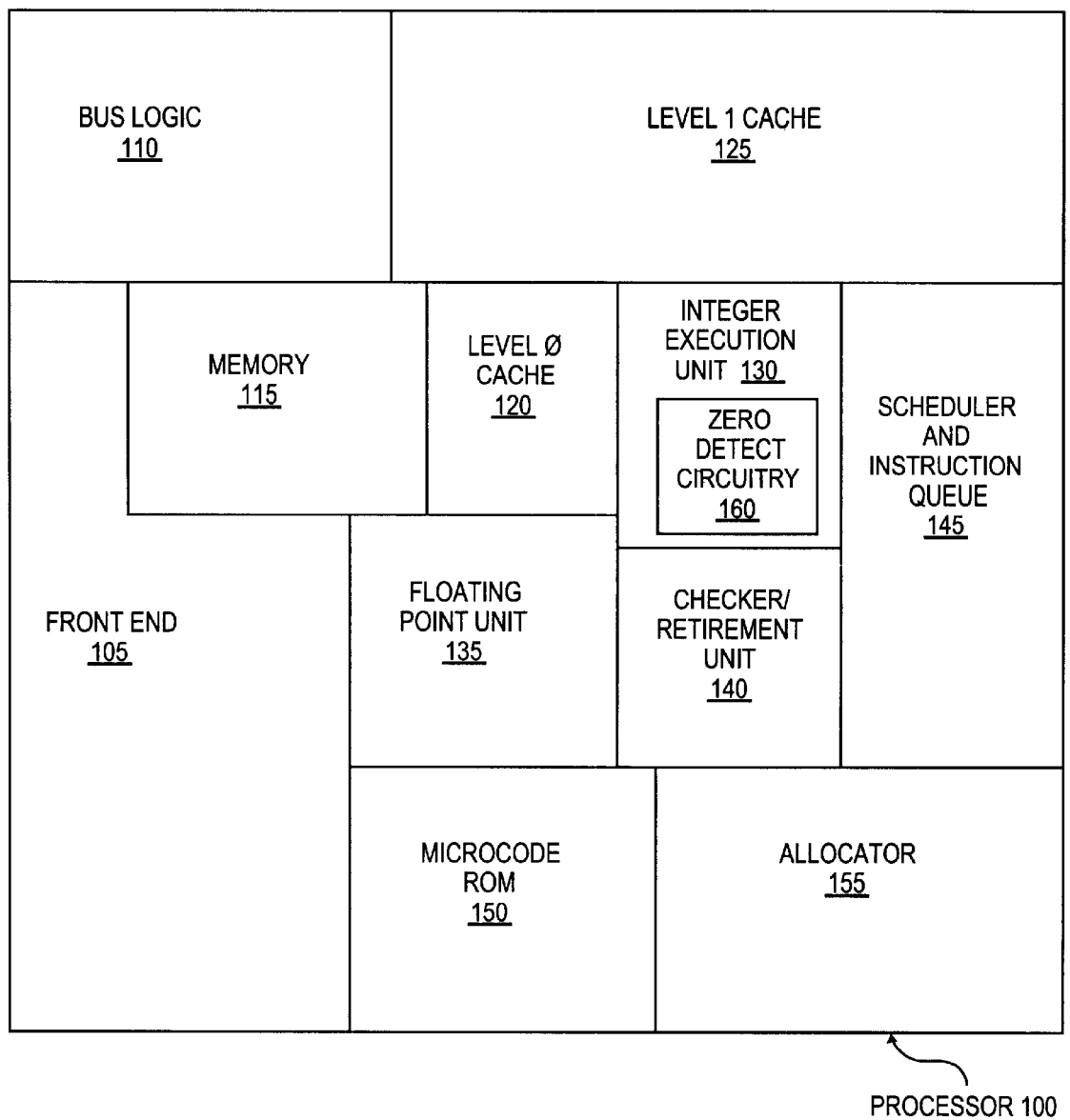
FIG. 1 is a high level block diagram of a microprocessor that may include the zero detect circuitry of one embodiment.

FIG. 1 is a high level block diagram of a microprocessor 100 that may use zero detect circuitry, including the zero detect circuitry of various embodiments described below. The microprocessor 100 includes front end logic 105, bus logic 110, memory 115, level 0 and level 1 cache memory 120 and 125, integer and floating point execution units 130 and 135, a checker and retirement unit 140, a scheduler and instruction queue 145, microcode read-only memory (ROM) 150 and an allocator 155. As shown in FIG. 1, the integer execution unit 130 of the processor 100 includes zero detect circuitry 160. Zero detect circuitry may also be included in other areas of the processor such as, for example, the front end 105 and/or the floating point unit 135.

Reference is made to zero detect circuitry in the integer execution unit 130 of a microprocessor 100 for purposes of example. It will be appreciated that the zero detect circuitry of various embodiments may be included in other areas of a processor or in other types of integrated circuit devices.

Figure 2:
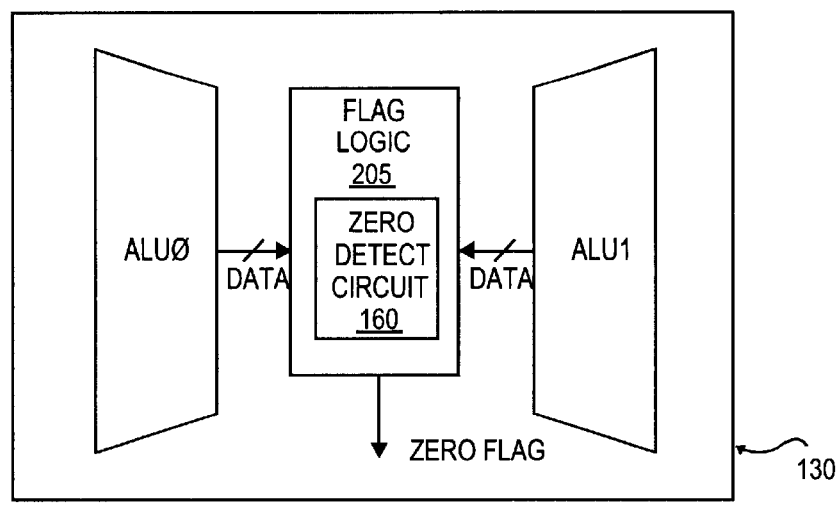
FIG. 2 is a block diagram showing how a zero detect circuit may be used in a flag generation datapath in a microprocessor.

FIG. 2 is a block diagram showing a portion of the integer execution unit 130 in more detail to illustrate how zero detect circuitry may be used. In the exemplary integer execution unit 130 of FIG. 2, arithmetic logic units ALU0 and ALU1 each provide data to flag generation logic 205. A zero detect circuit 160 evaluates all or a portion of the data received from one or both of the ALUs to determine whether the portion of the data evaluated is all zeros. If the portion of the data evaluated is all zeros, a zero flag may be set.

Figure 3:
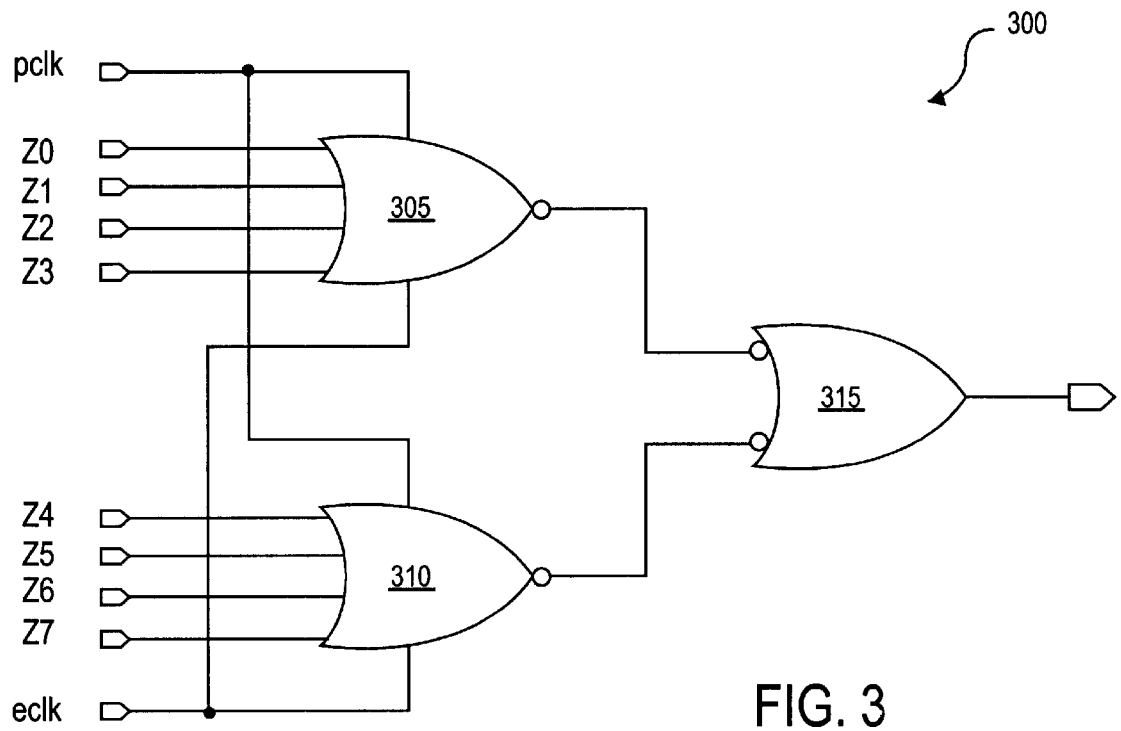
FIG. 3 is a logic diagram of an exemplary 8-bit zero detect circuit that may be used in the processor of FIG. 1.

FIG. 3 is a logic diagram of an 8-bit wide zero detect circuit 300, one or more of which may be used, for example, to implement the zero detect circuit 160 in the integer execution unit 130 of FIGS. 1 and 2.

The zero detect circuit 300 includes four-input NOR gates 305 and 310. The NOR gate 305 receives data inputs z0–z3 while the NOR gate 310 receives data inputs z4–z7. The implementation shown in FIG. 3 is a domino implementation. Thus, each of the NOR gates 305 and 310 also receives a precharge clock signal (pclk) and an evaluate clock signal (eclk) as shown. Inverses of the outputs of the NOR gates 305 and 310 are coupled to a two-input OR gate 315.

For one embodiment, the pclk and eclk signals are non-overlapping pulsed clock signals, i.e. the active pulses of the pclk and eclk signals do not overlap. The pclk signal and eclk signals for one embodiment may be generated locally by different pulsed clock generators (not shown).

In operation, if the data input signals z0–z7 all indicate zero data, the outputs of both NOR gates 305 and 310 transition to a logic high level (referred to herein as a 1 or logic 1) and the output of the OR gate 315 transitions to a logic low level (referred to herein as a 0 or logic 0).

Alternatively, if any one or more of the data input signals z0–z7 is at a logic high level, the output of the corresponding NOR gate 305 or 310 will transition to a logic low level. This will cause an output of the OR gate 315 to transition to a logic high level to indicate that the input data is not all zeros.

Where a wider zero detect circuit that receives more than 8 bits of input data is desired, multiple circuits similar to the circuit 300 may be cascaded. In such a case, the outputs of the multiple OR gates (similar to the OR gate 315) may be received by a multi-input logic gate to provide the desired result. Alternatively, the outputs of the NOR gates in the cascaded configuration may each be received by a single, multi-input logic gate that performs the desired logic operation.

Figure 4:
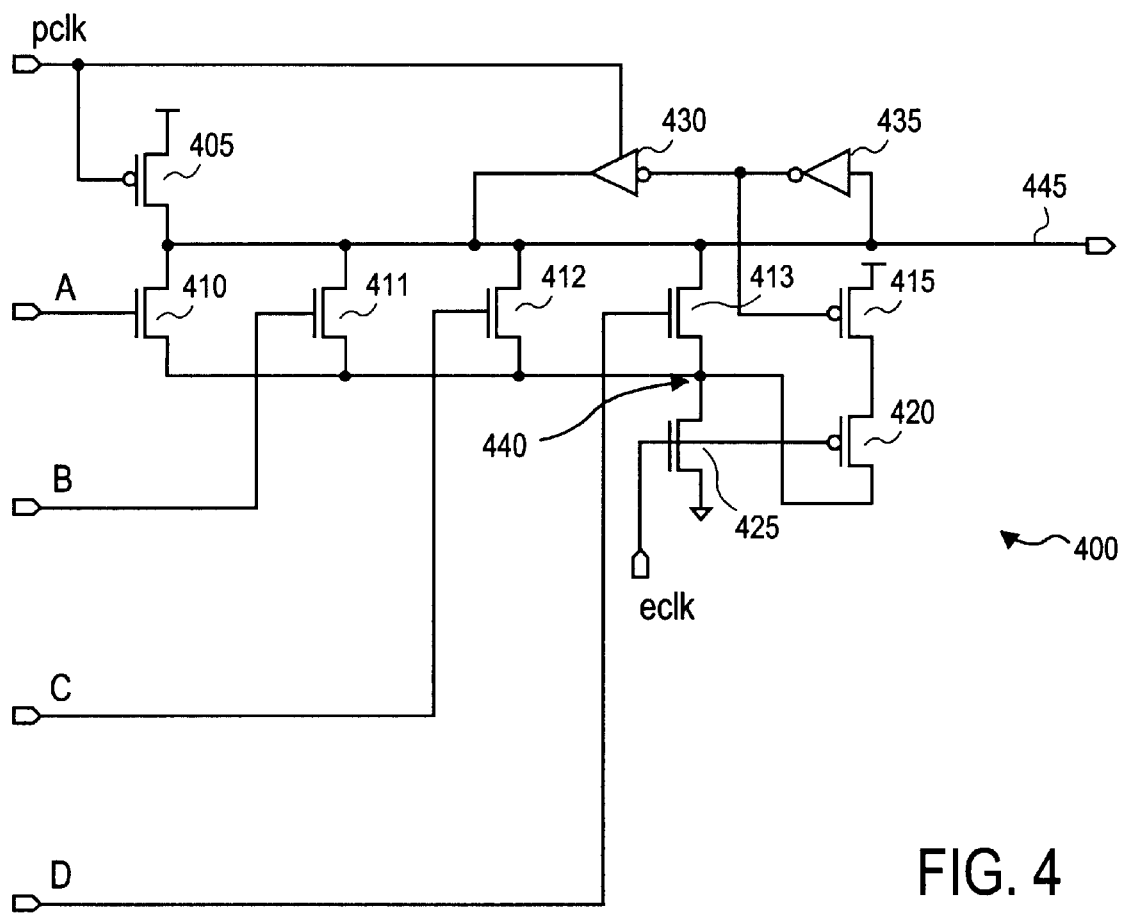
FIG. 4 is a schematic diagram of an exemplary zero detect circuit that is implemented in domino logic with pulsed clocks and may be used in the zero detect circuit of FIG. 3.

FIG. 4 is a schematic diagram of a circuit 400 that may be used to implement one or both of the NOR gates 305 and/or 310 in the circuit 300 of FIG. 3. It will be appreciated that NOR gates themselves are zero detect circuits. Thus, the four-input NOR gate 400 may also be referred to herein as a zero detect circuit or a four-bit wide zero detect circuit.

The circuit 400 includes an output node precharge device 405, four data transistors 410–413, intermediate precharge devices 415 and 420 (also referred to herein as internal node precharge devices), a clocked evaluate transistor 425, and an n-interrupted keeper circuit including inverters 430 and 435.

The four data transistors 410–413 are coupled in parallel and each have one terminal coupled to a terminal of the output node precharge device 405 and another terminal coupled to an internal node 440. The gates of the transistors 410–413 are coupled to receive input signals via inputs A, B, C and D, respectively, over corresponding input signal paths. The other terminal of the output node precharge device 405 is coupled to a power supply and its gate is coupled to receive the precharge clock (pclk) signal. The clocked evaluate transistor 425 has one terminal coupled to the internal node 440 and the other terminal coupled to ground. The intermediate precharge devices 415 and 420 are coupled in series between a power supply and the internal node 440. The internal precharge device 420 has its gate coupled to receive an evaluate clock (eclk) signal while the internal precharge device 415 has a gate coupled to an output of the transistor 435 in the keeper circuit. The inverter 435 has an input coupled to an output node 445 and its output coupled to the input of the inverter 430. The inverter 430 receives the pclk signal at a control input and has an output coupled to one terminal of each of the data transistors 410–413 and the output node precharge device 405.

For one embodiment, the pclk signal is a pulsed low clock signal and the eclk signal is a pulsed high clock signal. Also for one embodiment, the active pulses of the pclk and eclk signals are non-overlapping to avoid concurrently enabling pull-up and pull-down paths in the circuit 400.

In operation, when pclk is pulsed low, the output node precharge device 405 is enabled such that the output node 445 is precharged high. Additionally, the pulldown path of the keeper circuit is disabled at the inverter 430. A high value at the output node can continue to recirculate, however. Further, when the eclk signal is pulsed low and the output node 445 is high, the internal node 440 is precharged high.

When the pclk signal is pulsed high, the precharge transistor 405 is disabled and the pulldown path of the keeper circuit including the inverters 430 and 435 is enabled such that the node 445 becomes a recirculating node, regardless of the value at the output node 445. The keeper circuit maintains the precharged high value at the node 445 until the circuit evaluates low or until the next clock cycle, whichever occurs first.

As the eclk signal transitions from a low level to a high level, the intermediate precharge device 420 is disabled and the clocked evaluate device 425 is enabled to provide a path to ground for the data devices 410–413. If data at any of the inputs A, B, C or D is equivalent to a logical one, the output node 445 is pulled down to indicate that the input data is not all zeros. If input data at all of the inputs A–D is equivalent to a logical zero, however, the output node 445 maintains its precharged high value.

The circuit 400 may be used because it provides a domino implementation of a zero detect circuit, and thus, is faster than its static CMOS counterpart. The circuit 400, however, has some disadvantages that may compromise the performance of a host integrated circuit and thus, make it undesirable for use in high frequency integrated circuits.

For example, in terms of the circuit layout, the exemplary 4-wide NOR gate has four inputs that are to be routed from a datapath slice that typically has a regular pitch. Thus, the input routes for the inputs B–D to the gates of the transistors 411–413, respectively, are each progressively longer than the input route from the input A to the gate of the transistor 410. Longer input routes can result in speed and performance loss due to additional resistance and capacitance of the metal lines and can also have adverse effects with respect to noise.

Additionally, the circuit 400 may provide a negative timing design window. With continuing reference to FIG. 4, transistors 420 and 425 are both clocked by the eclk signal. The transistor 415, which is in series with the transistor 420, is enabled one inversion after the circuit 400 evaluates in response to the eclk signal.

For purposes of example, it is assumed that the data inputs B–D are tied low and only the input A is toggled. If A is low, but then toggles high before the end of the eclk pulse, the circuit 400 will evaluate falsely. Thus, low input data must be held low for a given period of time to avoid a false evaluation.

Further, to avoid charge sharing that may also result in a false evaluation, low input data may need to be held low even after the eclk pulse goes away. Charge sharing may be an issue if the intermediate node 440 is not precharged before the low data on the input A transitions to a high value. Thus, for the circuit 400, low input data should be held low until the node 440 is adequately precharged even after the eclk pulse has ended.

In high frequency integrated circuits, this hold time requirement may be unacceptable and may even result in a negative timing design window such that there is no available time to do useful logic while still meeting other timing requirements.

The circuit 400 has an additional disadvantage in that the transistor 425 that is clocked by the eclk signal is at the bottom of the circuit stack. Thus, in order to discharge the capacitance associated with devices higher in the stack to provide a path to ground in a time period of interest, the transistor 425 may have to be quite large.

Figure 5:
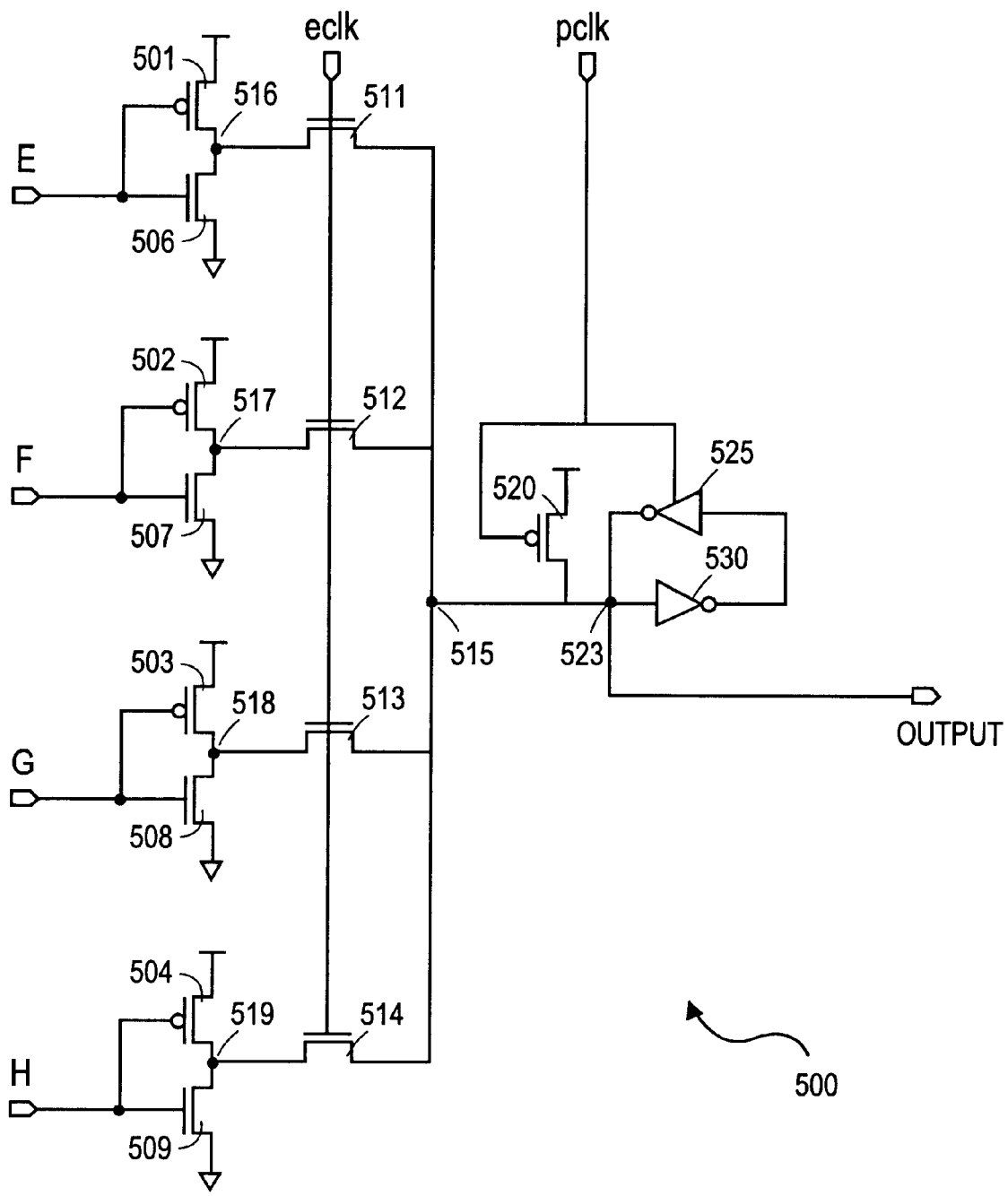
FIG. 5 is a schematic diagram of a zero detect circuit in accordance with one embodiment that is implemented using domino logic and may be used in the zero detect circuit of FIG. 3.

FIG. 5 is a schematic diagram of a zero detect circuit 500 that addresses many of the potential issues associated with the zero detect circuit of FIG. 4, and, therefore, may be more desirable for use in a high frequency integrated circuit. The zero detect circuit 500 may be used, for example, in the zero detect circuitry 160 of FIGS. 1 and 2 and/or in the zero detect circuitry 300 to implement one of the NOR gates 305 or 310. Other uses for the zero detect circuit 500 will be appreciated by one of ordinary skill in the art.

The zero detect circuit 500 receives input data via inputs E–H. The inputs are coupled to gates of data-driven, intermediate precharge devices 501–504 and to gates of data devices 506–509 that are coupled in series with the data-driven precharge devices 501–504. The precharge devices 501–504 each have a terminal coupled to receive a power supply voltage, while the data devices each have a terminal coupled to receive a ground supply voltage.

Clocked evaluate devices 511–514 are coupled in parallel and have gates that are coupled to receive an evaluate clock (eclk) signal. Each of the clocked evaluate devices 511–514 has one terminal coupled to a corresponding intermediate node 516–519 at a junction between one of the precharge devices 501–504 and one of the data devices 506–509, respectively. The other terminal of each of the clocked evaluate devices 511–514 is coupled to a node 515.

The circuit 500 also includes an output node precharge device 520 to precharge an output node 523, and an n-interrupted keeper circuit including an n-interrupted inverter 525 and an inverter 530. The precharge device 520 receives a precharge clock (pclk) signal at its gate. The pclk signal also controls the operation of the n-interrupted inverter 525.

For one embodiment, the eclk signal is a pulsed high clock signal while the pclk signal is a pulsed low clock signal. For this embodiment, as for the circuit 400 described above, the active pulses of the eclk and pclk signals are non-overlapping. The eclk and pclk signals may be provided by separate, local pulsed clock generators (not shown) that may or may not receive a common source clock signal.

In operation, when the pclk signal is pulsed low, the output node precharge device 520 is enabled and the output node 523 is precharged high. The pull down path of the n-interrupted keeper including the inverters 525 and 530 is disabled at this time. When the pclk signal then transitions to a logic high level, the precharge device 520 is disabled and the n-interrupted keeper pulldown path is enabled. The n-interrupted keeper circuit maintains the precharged high state of the output node 523 until it is pulled low during a subsequent evaluate or until the next clock cycle, whichever occurs first.

When the eclk signal is pulsed high, the output node 523 is pulled low if data at any one or more of the inputs E–H is not equivalent to a logical zero. If, instead, data at all of the inputs E–H is equivalent to a logical zero, then the output node 523 maintains its precharged high value. Because the pclk and eclk signals are non-overlapping signals as described above, when the eclk signal is pulsed high, the pclk signal is also pulsed high such that the n-interrupted keeper is enabled to latch the state of the output node 523 for use by downstream logic (not shown).

To provide for proper logical operation of the circuit 500, the data transistors 506–509 and the clocked evaluate transistors 511–514 are sized relative to the data-driven precharge devices 501–504 such that if non-zero data is received via only one of the inputs E–H, the output node 515 is still pulled low. For one embodiment, to accomplish this, the pull-down strength of the combination of each data transistor 506–509 and its corresponding clocked evaluate transistor 511–514 is at least five times the pull-up strength of the parallel combination of the non-corresponding data-driven precharge devices. For this embodiment, as an example, the pull-up strength of the combination of the data transistor 506 and the clocked evaluate transistor 511 is at least five times the pull-up strength of the parallel combination of the data driven precharge devices 502–504. In this manner, the pull-down strength at any input node is strong enough such that the output node 523 can be pulled down relatively quickly even where only one of the data inputs E–H receives non-zero data. Because the circuit 500 is clocked by pulsed clock signals, the contention between pull-up and pull-down devices in accordance with this configuration is acceptable due to the relatively short duration of such contention.

Devices sized in this manner may be referred to as ratioed logic. An example of ratioed logic is described in U.S. Pat. No. 5,942,917 to Chappell et al., issued Aug. 24, 1999 and assigned to the assignee of the present invention.

As shown, due to the spatial distribution of the data-driven precharge devices 501–504 and corresponding data devices 506–509, the input paths for each of the data inputs E–H may be the same or a similar, relatively short length while being routed from a datapath slice with a regular pitch. In this manner, longer input paths may be avoided such that speed and performance may be improved as compared to the circuit 400 of FIG. 4, for example.

Further, for the circuit 500, the intermediate nodes 516–519 are precharged by the data-driven precharge devices 501–504, respectively in response to data received over a corresponding one of the data inputs E–H. Such precharging occurs regardless of whether the eclk signal is pulsed high or pulsed low. This is in contrast to the circuit 400 in which the intermediate node of interest 440 is precharged in response to the eclk signal being pulsed low. While input data to the circuit 400 is to be held low long enough for the intermediate node 440 to be precharged even after the eclk signal goes low, such additional hold low time is not necessary for the circuit 500. Input data to the circuit 500 need only be held low long enough for the output node 523 to be adequately discharged where appropriate.

This can provide a designer with significantly increased flexibility in terms of designing with the circuit 500. It may be possible, for example, to provide for higher frequency operation and/or to implement a wider zero detect circuit using the circuit 500 as compared to the circuit 400 or to other, prior zero detect circuits.

Additionally, the data driven precharge devices 501–504 help to improve immunity to charge sharing noise. Referring to FIG. 4, when the eclk signal is pulsed low, any glitch on the eclk signal can enable the transistor 425 for a period of time. If the reference node 440 has been precharged high, enabling the transistor 425 even for a short period of time can leak some of the charge at the node 440.

In the circuit 500 of FIG. 5, however, if the input data is all zeros, the data-driven precharge devices 501–504 precharge the intermediate nodes 516–519 high. Since the output node 523 is high and the intermediate nodes 516–519 are high, charge sharing is not an issue with respect to these nodes in this case.

Also, the circuit 500 may provide a clock load savings as compared to the circuit 400 of FIG. 4. As described above, for high frequency operation, the transistor 425 may have to be quite large to discharge the diffusion capacitance associated with the devices higher up in the logic stack in order for the circuit 400 to evaluate in an acceptable timeframe. In the circuit 500, however, there are multiple clocked evaluate transistors such that the diffusion capacitance that each must discharge is lower as compared to the transistor 425. Further, because the clocked transistors 511–514 are further up in the stack (i.e. closer to the output node), the overall capacitance to be discharged by the clocked transistors is lower. For the embodiment shown in FIG. 5, the clocked evaluate transistors 511–514 are above the data transistors 506–509 in the stack and each of the evaluate transistors 511–514 has one terminal coupled to the output node 523.

For other embodiments, the circuit 500 may be implemented using complementary logic. For such an embodiment, the active portions of the pclk and eclk signals are also complementary.

Further, while an 8-bit zero detect circuit is shown in FIG. 3, it will be appreciated that the zero detect circuit 500 and the zero detect circuit of other embodiments may be used to implement a zero detect circuit having a different width (e.g. a 16-bit or 32-bit zero detect circuit). Additionally, the zero detect circuit of various embodiments may be used in integrated circuits other than microprocessors and/or in circuitry other than a flag generation unit.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:
   a data-driven intermediate precharge device coupled to each of a plurality of data inputs, the data-driven intermediate precharge device to precharge an internal node in response to a data signal received via the corresponding data input;
   an output node responsive to the data signals and to a first clock signal to indicate whether all of the data signals represent logical zero data; and
   a data device coupled to each of the plurality of data inputs and the corresponding data-driven intermediate precharge device, the data-driven intermediate precharge and data devices corresponding to a given data input being spatially distributed with respect to intermediate precharge and data devices corresponding to other data inputs such that input paths to each of the inputs are substantially similar in length.

2. The circuit of claim 1 further comprising:
   a clocked evaluate device coupled to the data inputs, the clocked evaluate device being responsive to the first clock signal to indicate at the output node whether the input data represents all zeros, the clocked evaluate device being above the data devices in a stack and having one terminal coupled to the output node.

3. The circuit of claim 1 wherein
   the first clock signal is a pulsed evaluate clock signal.

4. The circuit of claim 3 further comprising:
   a clocked evaluate device coupled to each of the data inputs, the clocked evaluate devices being responsive to the pulsed evaluate clock signal to indicate at the output node whether the input data represents all zeros.

5. The circuit of claim 4 wherein
   a combination of each data device and clocked evaluate device associated with a given data input are sized with respect to a corresponding data-driven precharge device such that the output node is capable of indicating whether any one data input receives non-zero data.

6. The circuit of claim 3 further comprising:
   a clock input to receive a second clock signal, the second clock signal being a pulsed precharge clock signal, wherein active portions of the first and second clock signals are non-overlapping.

7. The circuit of claim 6 further comprising:
   an output node precharge device, the output node precharge device to precharge an output node in response to the precharge clock signal.

8. The circuit of claim 6 further comprising:
   a keeper circuit responsive to the second clock signal to latch data indicated at the output node.

9. A circuit comprising:
   a data input device corresponding to each of a plurality of data inputs, the data input devices being responsive to data received via the data inputs;
   a clocked evaluate device above the data input devices in a stack; and
   an output node coupled to at least one terminal of the clocked evaluate device, the output node to indicate whether data received via the data inputs is all zeros, the clocked evaluate device being responsive to a first pulsed clock signal to communicate signals from the data input devices to the output node.

10. The circuit of claim 9 further comprising:
    a data-driven precharge device coupled to each of the data input devices, each of the data driven precharge devices being responsive to input data to precharge an intermediate node of the circuit.

11. The circuit of claim 10 wherein
    each pair including a data-driven precharge device and a data input device is spatially distributed with respect to other pairs of data-driven precharge devices and data input devices such that an input path coupled to each pair of data-driven precharge devices and data input devices is substantially similar in length.

12. The circuit of claim 9 further comprising:
    a precharge device coupled to the output node, the precharge device to precharge the output node in response to a second pulsed clock signal, wherein an active portion of the first pulsed clock signal is non-overlapping with respect to an active portion of the second pulsed clock signal.

13. The circuit of claim 9 further comprising:
    a latch circuit coupled to the output node, the latch circuit to latch a state of the output node.

14. A processor comprising:
    a zero detect circuit, the zero detect circuit including
       a data-driven intermediate precharge device coupled to each of a plurality of data inputs, the data-driven intermediate precharge device to precharge an internal node in response to a data signal received via the corresponding data input;
       an output node responsive to the data signals and to a first clock signal to indicate whether all of the data signals represent logical zero data; and
       a data device coupled to each of the plurality of data inputs and the corresponding data-driven intermediate precharge device, the data-driven intermediate precharge and data devices corresponding to a given data input being spatially distributed with respect to intermediate precharge and data devices corresponding to other data inputs such that input paths to each of the inputs are substantially similar in length.

15. The processor of claim 14 wherein the zero detect circuit is included within an integer execution unit.

16. The processor of claim 14 wherein the first clock signal is a pulsed clock signal.

17. The processor of claim 16 wherein the zero detect circuit further comprises:
    a clocked evaluate device coupled to each of the data inputs, the clocked evaluate devices being responsive to the pulsed clock signal to indicate at the output node whether the input data represents all zeros, the clocked evaluate devices being above the data devices in a stack and having one terminal coupled to the output node.

* * * * *